United States Patent [19]  [11] 4,121,296
Snijders et al. [45] Oct. 17, 1978

[54] DIGITAL SIGNAL PROCESSING ARRANGEMENT

[75] Inventors: Wilfred André Maria Snijders; Nicolaas Alphonsus Maria Verhoeckx; Petrus Josephus Van Gerwen; Hendrik Arie Van Essen, all of Eindhoven, Netherlands

[73] Assignee: U.S. Philips Corporation, New York, N.Y.

[21] Appl. No.: 808,095

[22] Filed: Jun. 20, 1977

[30] Foreign Application Priority Data

Jul. 12, 1976 [NL] Netherlands ............ 7607682

[51] Int. Cl.² ............................... G06F 15/34
[52] U.S. Cl. ................... 364/724; 328/167; 333/18; 333/70 T
[58] Field of Search ............. 364/724; 325/42; 333/18, 28 R, 70 T; 328/167

[56] References Cited

U.S. PATENT DOCUMENTS 3,522,546  8/1970  Jackson et al. .............. 328/167
3,979,701  9/1976  Tomozawa .................. 333/70 T Primary Examiner—Jerry Smith
Attorney, Agent, or Firm—Frank R. Trifari; Daniel R. McGlynn

[57] ABSTRACT

Digital signal processing arrangement such as a digital filter for computing output signal samples which are each equal to the sum of products of a given plurality of pairs (for example N) of input signal samples. One of the input signal samples of the pair is, for example, formed each time by a sample $x(n)$ of a digital signal to be filtered, the other input signal sample of the pair by a filter coefficient $z(n)$, wherein either the sample $x(n)$ or the filter coefficient $z(n)$ can assume only a limited number of values 0, $\pm A_1$, $\pm A_2$, ... $\pm A_M$, M being much smaller than N. In the case $x(n)$ can assume only this limited number of values, $z(n)$ is first multiplied, owing to the $x(n)$ belonging to the pair, by the sign of $x(n)$ for generating a product of the form $z(n) \cdot \text{sgn}[x(n)]$. Independent of the magnitude of $n(n)$ this product is applied to an accumulator which corresponds with this magnitude of $x(n)$. N products have been applied to one of the M accumulators the partial sums stored therein are multiplied by the magnitude $|x(n)|$ corresponding therewith and the products obtained are added together.

1 Claim, 8 Drawing Figures

DIGITAL SIGNAL PROCESSING ARRANGEMENT

BACKGROUND OF THE INVENTION

1. Field of the Invention

The invention relates to a digital signal processing arrangement for generating digital output signal samples $y(n)$ which are each formed by the sum of a given plurality of first signal samples $x(n)$ which are each modified by one out of a plurality of second signal samples $z(n)$, the signal processing arrangements comprising:

first means for serially supplying the first signal samples $x(n)$;

second means for serially supplying the second signal samples $z(n)$;

multiplying means having an input circuit and an output circuit;

first coupling means for coupling the input circuit of the multiplying means to the first and the second means;

adding means coupled to said multiplying means.

2. Description of the Prior Art

When designing systems for digital signal processing the designer is often confronted by the task to implement an ambiguously given mathematical operation such as a digital convolution in filters or digital correlation in correlators in such a way that given requirements are satisfied which are imposed on, for example, the complexity of the equipment on the one hand and the internal processing speed on the other hand. These requirements are often imposed compulsorily by the designer to enable the realization of the system under consideration as one integrated circuit on a semiconductor body, with a given maximum complexity and processing speed or as a computing instruction (algorithm) in a micro-processor with given internal structure and given maximum processing speed.

The invention is the result of investigations in the field of modems which are used to enable the transmission of synchronous data signals over existing telephone channels and in which the data signals are subjected to several processing operations, including filtering.

A frequently used digital filter is the non-recursive digital filter with which in response to a digital input signal $x(n)$ wherein $(-\infty < n < \infty)$ and in response to a plurality of mutually different coefficients $z(n)$ wherein $(0 \leq n \leq N-1)$ a digital output signal $y(n)$ with $(-\infty < n < \infty)$ is obtained. The relation between $x(n)$, $z(n)$ and $y(n)$ being given by the expression $$y(n) = \sum_{i=0}^{N-1} z(i) \cdot x(n - i) \qquad (1)$$

Another processing operation whose mathematical representation is greatly identical to expression (1) is encountered in the calculation of the correlation function $R(m)$ of two digital signals $u(n)$ and $v(n)$. This processing operation can be represented by $$R(m) = \sum_{i=0}^{N-1} u(i) \cdot v(m + i) \qquad (2)$$

In what follows hereinafter only the digital filter processing will be considered, however, what follows hereinafter also applies to digital correlation or other processes which consist of forming the sum of a finite plurality of products of pairs of numbers.

In prior art non-recursive digital filters N-multiplications of pairs of numbers $z(i)$ and $x(n-i)$ and N additions of the product thus obtained are performed for calculating one output signal sample $y(n)$ in accordance with the expression (1). This may be accompanied by an exchange between the number of multipliers which is used and the total time $T_{tot}$ which is required for calculating one output signal sample. When using V multipliers ($1 \leq V \leq N$) which can each perform a multiplication in a time $T_m$ and an accumulator which can perform an addition in a time $T_a$ it applies that:

$$T_{tot} = (N/V) \cdot T_m + N.T_a \qquad (3)$$

wherein for simplicity it is assumed that N can be divided by V; if this is not the case then in expression (3) the factor N/V must be replaced by the smallest integer which exceeds N/V.

In, for example, data transmission systems intended for transmitting synchronous data signals filters are commonly used at the transmitter end to which an input signal is applied which can assume only a limited number of mutually different values. These values are determined by the so-called "Signal constellation" of the system (see reference 1). These values may, for example, be selected from the set $(-3, -1, +1, +3)$ or from the set $(-5, -3, -\sqrt{2}, 0+\sqrt{2}, +3, +5)$.

SUMMARY OF THE INVENTION

It is an object of the invention to provide another concept of a digital signal processing arrangement of the type described in the preamble which is arranged for generating digital output signal samples $y(n)$ which are each formed by the sum of a given number of first signal samples $x(n)$ which can each assume only a limited number of mutually different values and which are each modified by one of a plurality of second signal samples $z(n)$, the number of possible mutually different values of $x(n)$ being smaller than the plurality of second signal samples $z(n)$.

The above and other objects are accomplished because in accordance with the invention said first coupling means comprises:

means which are coupled to said first and second means and which are arranged for modifying each of the second signal samples $z(n)$ with an algebraic coefficient sgn $[x(n)]$ which represents the polarity of the first signal samples $x(n)$ associated with a signal sample $z(n)$, for generating signal samples of the form $z(n)$.sgn $[x(n)]$;

a plurality of auxiliary accumulators which each correspond to one of the magnitudes $|x(n)|$ of the first signal samples $x(n)$ and whose outputs are coupled to the input circuit of the multiplying means for multiplying the contents of each of the auxiliary accumulators by the algebraic factor $|x(n)|$, corresponding therewith;

second coupling means which are controlled by said first signal samples $x(n)$ for applying the signal samples $z(n)$. sgn $[x(n)]$ to that auxiliary accumulator which corresponds with the magnitude $|x(n)|$ of the first signal sample $x(n)$ associated with the second signal sample $z(n)$.

By applying the measures according to the invention another relation is realized than that of expression (3) between the plurality of multipliers and the totally required time for calculating one output signal sample $y(n)$. This makes it possible to reduce, by means of a given number of multipliers (for example $V=1$) the computation time required for determining an output signal sample $y(n)$, or vice versa, to enlarge with a given maximum available computation time per output signal sample the time ($T_m$) available for performing a multiplication or the time ($T_a$) available for performing an addition. This may lead to a lower dissipation or to the use of slower and cheaper component or IC-technologies.

The principle of the invention will now be briefly explained. When realizing a digital filter in which the signal samples $x(n)$ only assume the values 0, $\pm A_1$, $\pm A_2, \ldots, +A_M$ (with $A_i > 0$), in a direct implementation of expression (1), N multiplications and N additions must be performed in order to determine one output signal sample $y(n)$. In accordance with the invention the signal samples $x(n)$ are considered as being built up from the product of two components in accordance with the expression:

$$x(n) = |x(n)| \cdot sgn\,[x(n)] \qquad (4)$$
wherein:
$$sgn\,[x(n)] = -1 \text{ for } x(n) < 0 \qquad (5)$$
$$= 0 \text{ for } x(n) = 0$$
$$= +1 \text{ for } x(n) > 0$$

Expression (1) may now be written as:

$$y(n) = A_1 \sum_i z(i)\,sgn\,[x(n-i)] + \qquad (6)$$
$$A_2 \sum_i z(i)\,sgn\,[x(n-i)] + \ldots A_M \sum_i z(i)\,sgn\,[x(n-i)]$$

In the first part of the sum in expression (6) $i$ assumes those values which correspond with those signal samples $x(n-i)$ for which it applies that $|x(n-i)| = A_1$. In a corresponding manner $i$ in the second and in the $M^{th}$ sum in expression (6) assumes those values which correspond to those signal samples $x(n-i)$ for which it holds that $|x(n-i)| = A_2$ and $|x(n-i)| = A_M$ respectively. The first partial sum in expression (6) contributes towards an output signal sample $y(n)$ of all those signal samples $x(n-i)$ where $0 \leq i \leq N-1$ for which it holds that $|x(n-i)| = A_1$. Likewise the second partial sum in expression (6) contributes towards an output signal sample $y(n)$ of all those signal samples $x(n-i)$ where $0 \leq i \leq N-1$ for which it holds that $|x(n-i)| = A_2$ and so on.

The gist of the invention is that first M partial sums are formed which consist of the sum of a plurality of coefficients $z(i)$ which, under the control of $x(n-i)$ are multiplied by $-1$, 0 or $+1$. Thereafter each of these partial sums is separately multiplied by the associated value $A_1, A_2, \ldots A_M$ whereafter the results of these last products are added together.

Multiplying the coefficients $z(i)$ by the values $-1$, 0 or $+1$ is particularly simple in the sense that these multiplications can be effected by means of a simple combinatory circuit and, consequently, demands an additional time of computation which can be neglected. Hereinafter this type of multiplication will be indicated as sign-multiplication.

For the formation of the M partial sums a maximum of M additions are required because for each value of $i$, ($0 \leq i \leq N-1$), the value of not more than one of the partial sums changes. Thus, calculating an output signal sample in accordance with the expression (6) only requires the following operations:

N + M additions
M full multiplications
N sign multiplications

However, a signal multiplication can be easily combined with other operations such as storing a number in a register so that the sign multiplication does not demand additional time of computation. When V multipliers are used the arrangement according to the invention for determining one output signal sample $y(n)$ requires a time of computation $T_{tot}$ which is given by $$T_{tot} = (M/V) \cdot T_m + (M+N)T_a \qquad (7)$$

in which it is again assumed for simplicity that M can be divided by V; if this is not the case then in expression (7) the factor M/V must be replaced by the smallest integer which exceeds M/V. As an adding operation generally requires considerably less time than a full multiplication ($T_a < T_m$) it can be inferred from a comparison of expressions (7) and (3) that with a given number of multipliers calculating an output sample $y(n)$ can be performed much quicker for many combinations of values of M and N with an arrangement according to the invention than with a prior art arrangement. In the above-mentioned field of the synchronous data transmission it may apply, for example, that $M = 3$ and $N = 30$. It follows from expression (3) that in the case $T_m = 8T_a$ a prior art arrangement in which one multiplier is used ($V = 1$) calculating one output signal sample $y(n)$ requires a total time:

$$T_{tot} = 270\,T_a \qquad (8)$$

It follows from expression (7) that in an arrangement according to the invention (in which it also applies that $V=1$) a period of time is only required which is given by:

$$T_{tot} = 57\,T_a \qquad (9)$$

The arrangement in accordance with the invention is furthermore perfectly suitable for implementation by means of a micro-processor, because micro-processors due to their structure, more particularly by the presence of a plurality of registers for storing intermediate results, are very suitable for forming partial sums while, on the other hand, they render it necessary, due to their given maximum internal processing speed to limit the number of operations which demand relatively much time, such as full multiplications as far as possible. In this manner it becomes possible to use micro-processes for applications for which the computational capacity of these processors would otherwise be insufficient.

REFERENCES

1. On the selection of a two dimensional signal constellation in the presence of phase jitter and gaussian noise; G. J. Foschini, R. D. Gitlin and S. B. Weinstein, Bell System Technical Journal, July-August 1973, pages 927-965.
2. Theory and Application of Digital Signal Processing (chapter 9); L. R. Rabiner and B. Gold; Prentice Hall Inc.; 1975
3. Arithmetic Operations in Digital Computers; R. K. Richards; D. Van Nostrand Company, Inc. 1957.

DESCRIPTION OF THE PREFERRED EMBODIMENTS

Figure 1:
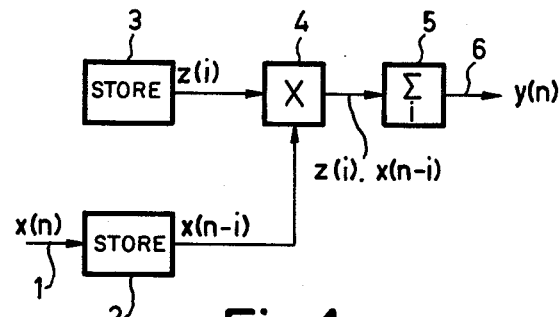
FIG. 1 shows a prior art non-recursive digital filter.
Figure 2:
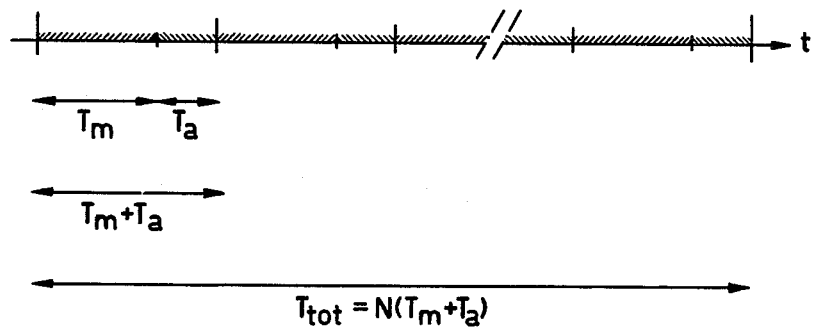
FIG. 2 is a time diagram for explaining the arrangements of FIG. 1.

FIG. 1 shows the block diagram of a known non-recursive digital filter with one multiplier. The digital signal $x(n)$ to be filtered is applied to the input 1 of a storage device 2 which is suitable for storing all input samples which are required for calculating one output sample $y(n)$ in accordance with expression (1). This storage device may, for example, be formed by a circulating shift register or a "random access memory" (RAM). The N filter coefficients $z(n)$ are stored in a second storage device (3). As a rule this storage device is constructed as a "read-only memory" (ROM). In known manner there are successively applied to the two inputs of the digital multiplier 4 pairs of a signal sample $x(n-i)$ and a filter coefficient $z(i)$ from storage devices 2 and 3 which are multiplied by one another in accordance with expression (1). The product of this multiplication appears at the output of multiplier 4 which is connected to the input of an accumulator 5. At the beginning of the calculation which must result in an output signal sample $y(n)$ the contents of the accumulator is reset to zero. Thereafter the N products are sequentially calculated by the multiplier and these products are added together in the accumulator whereafter the output signal sample $y(n)$ becomes available at output 6 for any further processing. For calculating the next output signal sample $y(n+1)$ the oldest present input signal sample in the storage device 2 is replaced by a new input signal sample $x(n+1)$, the accumulator 5 is reset to zero whereafter the following computation starts. In FIG. 2 the operation of the arrangement of FIG. 1 is further explained in a time diagram. Herein $T_m$ indicates the time the multiplier requires for calculating one product $z(i)\cdot x(n-i)$, $T_a$ the time required for adding this product to the contents of the accumulator. The time diagram shows that the total time $T_{tot}$ which the arrangement of FIG. 1 requires for calculating one output sample is given by:

$$T_{tot} = N(T_m + T_a) \quad (10)$$

which corresponds with expression (3) by putting therein that $V=1$.

Figure 3:
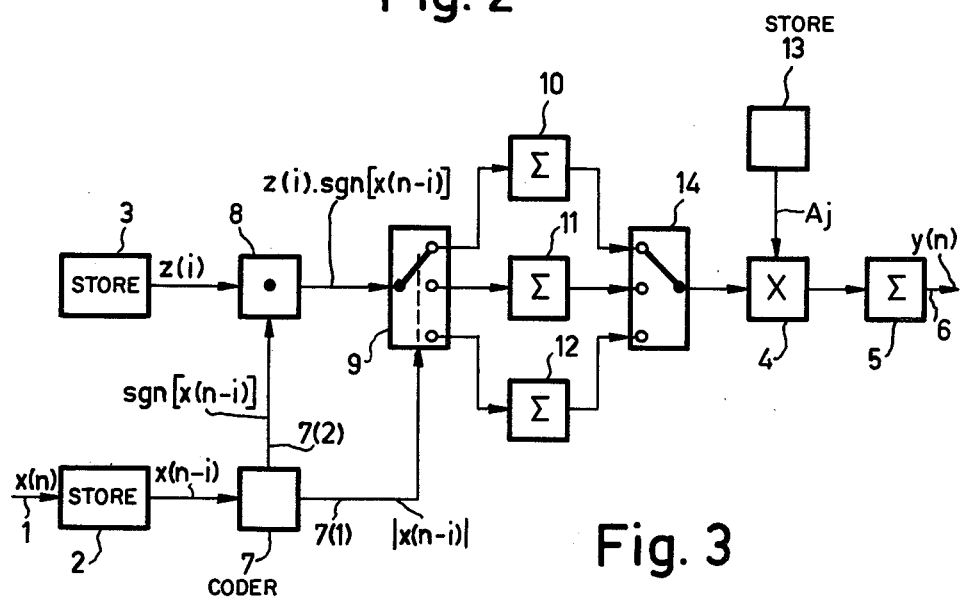
FIG. 3 shows a digital signal processing arrangement according to the invention in the form of a non-recursive digital filter.

FIG. 3 shows an arrangement according to the invention in the form of a non-recursive digital filter with one multiplier and which is arranged for performing the operations defined in expression (6). In this FIG. 3 the elements which correspond with the elements of FIG. 1 are indicated by the same reference numerals as in FIG. 1. So the arrangement shown in FIG. 3 also comprises an input 1 to which the input signal samples $x(n)$ are applied, a storage device 2 for storing N input signal samples $x(n), x(n-1), x(n-2), \ldots x(n-N+1)$, a coefficient storage device 3 for storing N filter coefficients $z(i)$, a multiplier 4, an accumulator 5 and an output 6. Now, however, the output of the storage device 2 is connected to the input of a coder 7 having two output circuits 7(1) and 7(2). As a result of the input signal samples $x(n-i)$ which are supplied by the storage device 2 this coder generates a first code word which is applied to the output circuit 7(1) and a second code word which is applied to the output circuit 7(2). Herein the first code word is representative of the magnitude or absolute value $|x(n-i)|$ of the relevant input signal sample $x(n-i)$ and the second code word is representative of the sign of $x(n-i)$ as defined in expression (5). If it is assumed that the input signal samples $x(n-i)$ stored in the storage device 2 can assume the values $\pm A_1$, $\pm A_2$, $\pm A_3$ which are unequal to zero then the first code words represent the values $A_1$, $A_2$ or $A_3$. Then, in accordance with expression (5) the second code words represent the values $-1$, $0$ or $+1$. More in particular, $A_1$ is for example represented by the code word 01, $A_2$ by the code word 10 and $A_3$ by the code word 11. In a corresponding manner the polarity value $-1$ is, for example, represented by the code word "01", the value 0 by "00" and the value $+1$ by "10". The output 7(2) of the coder 7 and the output of the coefficient storage device 3 are both connected to an input of a signal multiplier 8. As a result of the second code word the filter coefficient $z(i)$ which is available at the output of storage device 3 is multiplied in this sign multiplier 8 by one of the values $-1$, $0$ or $+1$. The output of the sign multiplier 8 is connected to the input of a selection device 9 which is only symbolically shown and which, in this embodiment, comprises three output circuits in which the auxiliary accumulators 10, 11, 12 respectively are included. This selector is controlled by the first code words which occur at the output 7(1) of the coder 7. More in particular this first code word determines to which of the auxiliary accumulators 10, 11 or 12 the output signal sample of the sign multiplier 8 must be applied. If the first code word represents the value $A_1$ then the output signal sample of the sign multiplier 8 is, for example, applied to the auxiliary accumulator 10. In the case the first code word represents the value $A_2$ or $A_3$ the output signal sample of the time multiplier 8 is applied to the auxiliary accumulator 11, or the auxiliary accumulator 12 respectively.

If the second code word represents the value 0 the selector 9 may effect any through-connection between its input and its output or, as an alternative possibility, no through-connection at all. In the embodiment of FIG. 3 it is assumed that if the second code word represents the value 0, that is to say $x(n-i) = 0$, the first code word represents the value $A_1$ which causes the output of the sign multiplier 8 to be connected to the input of the auxiliary accumulator 10.

Figure 4:
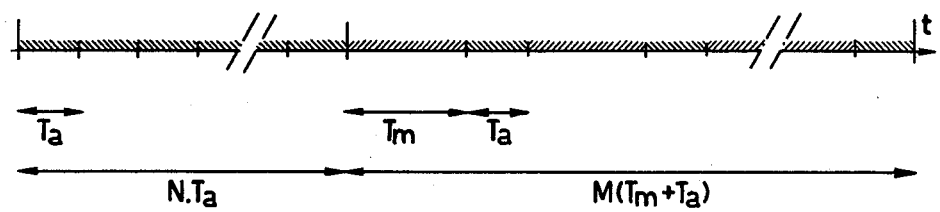
FIG. 4 is a time diagram for explaining the operation of the arrangement of FIG. 3.

The outputs of the auxiliary accumulators 10, 11 and 12 are successively connected to the inputs of the multiplier 4 through a multiplexer 14 which is only shown diagrammatically. A second input of this multiplier 4 is connected to the output of a storage device 13, which comprises the absolute values which differ from zero of the signal samples $x(n)$ in the storage device 2, that is to say the values $A_1$, $A_2$ and $A_3$. The control of the multiplexer 14 and the addressing of the storage device 13 are now coupled to one another in such a way that if the input of the multiplier 4 is connected to the output of the auxiliary accumulator 10 storage device 13 supplies the value $A_1'$ to the multiplier 4. If thereafter the input of the multiplier 4 is connected to the output of the auxiliary accumulator 11 then the storage device 13 supplies the value $A_2$. If, finally, the input of the multiplier 4 is connected to the output of the auxiliary accumulator 12 the storage device 13 supplies the value $A_3$. The products which become available at the output of the multiplier 4 are applied to the input of the accumulator 5. In this accumulator 5 these products are added together whereafter the output signal sample $y(n)$ appears at output 6. The operation of the circuit of FIG. 3 will now be further explained wherein use will be made of the time diagram of FIG. 4. At the beginning of the calculation of an output signal sample $y(n)$ the contents of the accumulator 5 and the accumulators 10, 11 and 12 are reset to zero. Thereafter, as with the known device of FIG. 1, N times a filter coefficient and an input signal sample are applied to the multiplier 8 and the coder 7. Under the control of the coder 7 the coefficient is added after sign multiplication to the contents of one of the auxiliary accumulators 10, 11 and 12. Because the sign multiplier 8 and the selector 9 may be constructed from combinatory networks the time necessary to perform this operation is determined by $T_a$, that is the time which is required to add one number to the contents of an accumulator. After a time interval $NT_a$ the contents of the auxiliary accumulators 10, 11, 12 consequently corresponds with the partial sum of expression (6). Now the multiplexer 14 successively connects the outputs of the auxiliary accumulators 10, 11, 12 to the input of multiplier 4 while the absolute value of $x(n-i)$ associated with the relevant auxiliary accumulator is presented applied to the other input of the multiplier 4. In this manner 3 products are successively produced at the output of the multiplier 4 which are added together in the accumulator 5 which in response thereto produces the output signal sample $y(n)$ whose value is given by expression (6). The multiplication in the multiplier 4 and the addition in the accumulator 5 in FIG. 3 occupies a period of time $3(T_m + T_a)$, $T_m$ and $T_a$ having been defined hereabove. In the general case that the input signal $x(n)$ can assume the values 0, $\pm A_1$, $\pm A_2$, ... $\pm A_M$ this time is equal to $M(T_m + T_a)$. So the total computation of one output signal sample $y(n)$ requires a time $T_{tot}$ which is given by $$T_{tot} = N.T_a + M(T_m + T_a) = M.T_m + (M + N)T_a \quad (11)$$

which corresponds with expression (7) by putting herein $V=1$. Here it is noted again that for many combinations of values of M and N, the time $T_{tot}$ required in an arrangement according to the invention (expression 11) is much shorter than the time $T_{tot}$ required in a known arrangement (expression 10) because in general $T_m$ considerably exceeds $T_a$.

The arrangement of FIG. 3 starts from the assumption that the numbers which are stored in the storage device (the input signal samples) assume a limited number of different values only, while the numbers which are stored in the storage device 3 (the filter coefficients) do not have this limitation. For those skilled in the art it will be clear that in the reverse situation the output of the storage device 3 must be connected to the input of the coder 7 and the output of the storage device 2 to the input of the sign multiplier 8, while then the contents of the storage device 13 is also determined by the absolute values of the numbers in storage device 3 which deviate from zero. In all further respects the arrangement in accordance with the invention remains unchanged. In this situation, however, it is also possible to combine the storage device 13 and the storage device 3 because all values which have been stored in the storage device 13 are also already stored in known places in the storage device 3.

Figure 5:
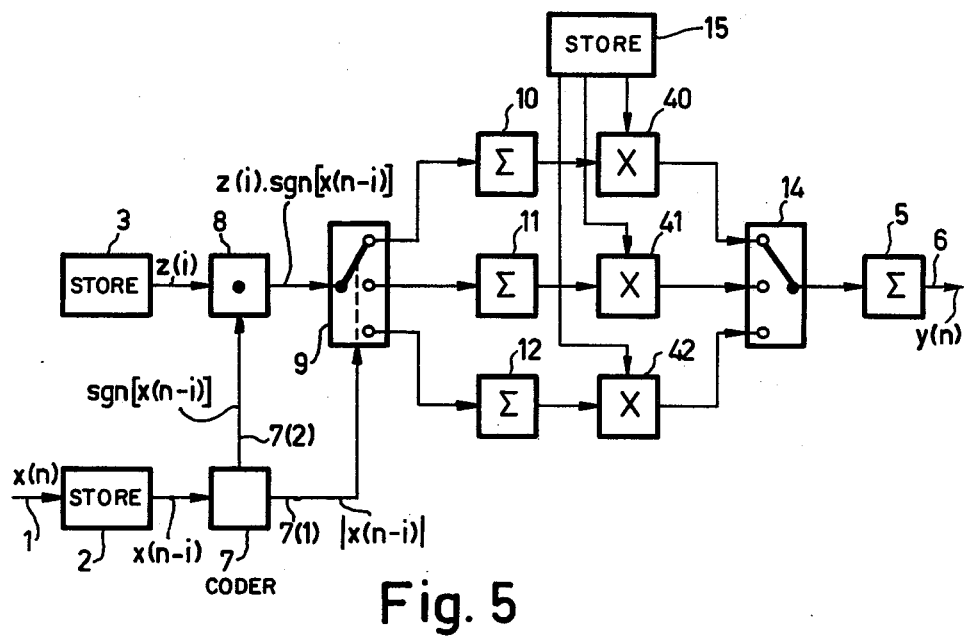
FIG. 5 shows a second embodiment of a digital signal processing arrangement according to the invention, also in the form of a non-recursive digital filter.
Figure 6:
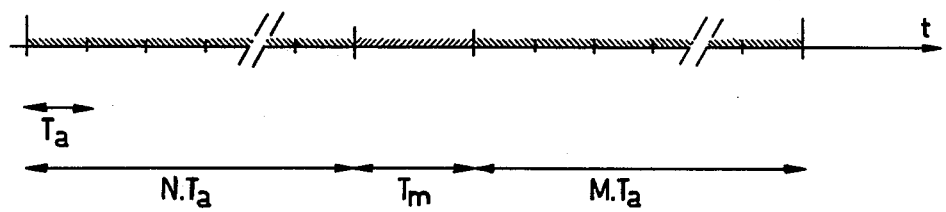
FIG. 6 is a time diagram for explaining the arrangement of FIG. 5.

FIG. 5 shows a non-recursive digital filter in accordance with the invention in which the multiplying devices are constituted by different multipliers. In the arrangement of FIG. 5 the plurality of multipliers is chosen to be equal to the plurality of auxiliary accumulators, that is to say 3 in this case. In this FIG. 5 elements corresponding to elements in FIG. 3 have been given the same reference numerals as in FIG. 3. A multiplier is now connected to the output of each of the auxiliary accumulators 10, 11 and 12. These multipliers are indicated by 40, 41 and 42 respectively. The outputs of these multipliers are connected to the inputs of the multiplexer 14 whose output is connected to the input of the accumulator 5. The storage device 15 contains the same numbers as the storage device 13 in FIG. 3. Now, however, storage device 15 comprises 3 outputs which are each connected directly to one of the multipliers 40, 41 and 42. The operation of FIG. 5 will now be further explained with reference to the time diagram of FIG. 6. At the start of the computation of an output signal sample $y(n)$ the contents of the auxiliary accumulators 10, 11 and 12 and of the accumulator 5 are reset to zero. Thereafter, in exactly the same manner as described for FIG. 3 one of the partial sums of expression (6) is formed in each of the auxiliary accumulators 10, 11, 12 by means of the coder 7, the multiplier 8 and the selector 9. This requires a period of time which is equal to $N.T_a$. Thereafter the contents of auxiliary accumulator 10 in amplifier 40 are multiplied by the value $A_1$ which is supplied by the storage device 15. Simultaneously the contents of the auxiliary accumulators 11 and 12 in the multipliers 41 and 42 are multiplied by the values $A_2$ and $A_3$ respectively which are also supplied by the storage device 15. In a period of time $T_m$ multiplications are performed in the multipliers whose product appears at the output. By the multiplex device 14 the outputs of the multipliers 40, 41, 42 are successively connected to the input of the accumulator 5 which adds these products together whereafter the calculated signal sample $y(n)$ becomes available at the output 6. In FIG. 5 this requires a period of time of $3T_a$. In the general case that the input signal $x(n)$ can assume the values 0, $\pm A_1$, $\pm A_2$, ... $\pm A_M$ this time is equal to $MT_a$. So the total calculation of one output sample occupies a period of time which is given by:

$$T_{tot} = T_m + (M+N)T_a \quad (12)$$

which corresponds with expression (7) by putting therein $V=M$. Comparing expression (12) and expression (11) shows that the filter of FIG. 5 requires still less computation time for calculating $y(n)$ than with the filter of FIG. 3, to the detriment of an extension of the plurality of multipliers.

Besides the arrangements according to the invention which are given in FIG. 3 and FIG. 5 there are a number of variants which can be easily deduced by those skilled in the art from the preceding descriptions. So there are a number of variants in which the number of multipliers V can be chosen larger than one and smaller than M and with which a computation time $T_{tot}$ can be realized which exceeds $T_{tot}$ of expression (12) but which is smaller than $T_{tot}$ of expression (11).

A further variant is obtained if in the series of words $0, \pm A_1, \pm A_2, \ldots \pm A_M$ which the input signal samples $x(n)$ can assume the values $A_i$, $A_j$ and $A_k$ are found for which it applies that:

$$A_i = A_j + A_k; i \neq j \neq k \tag{13}$$

In this case it may be advantageous to omit the auxiliary accumulator which is chosen by the selector 9 if the first code word occurring at the output 7(1) of the coder 7 represents the value $A_i$. Instead thereof two positions can be successively allotted to the selector when the input signal sample $x(n)$ having the value $A_i$ occurs, the output of the sign multiplier 8 being connected in the first position to the input of the accumulator to which the amplitude value $A_j$ has been applied, whilst in the second position the output of the sign multiplier 8 is connected to the input of the accumulator to which the amplitude value $A_k$ is applied. In this manner an exchange can take place between the complexity of the arrangement and the required computation time $T_{tot}$.

Another further variant is obtained if in the sequence of values which the input signal samples $x(n)$ can assume the values $A_i$ and $A_k$ are found for which it applies that:

$$A_i = 2^P A_k; \text{ with } P = \text{an integer} \tag{14}$$

Also in this case the auxiliary accumulator to which the amplitude value $A_i$ is applied can be omitted if the auxiliary accumulator to which the amplitude value $A_k$ is applied is constructed such that its contents cannot only be changed by $z(i)$ but also by $2^P z(i)$. Such accumulators are known in themselves, namely as shifting accumulator (see reference 3).

In the arrangements according to the invention shown in FIGS. 3 and 5 the auxiliary accumulators 10, 11 and 12 are formed by complete accumulators, that is to say that they each comprise an adder and a storage device whose input is connected to the output of the adder and whose output is connected to an input of the adder.

Figure 7:
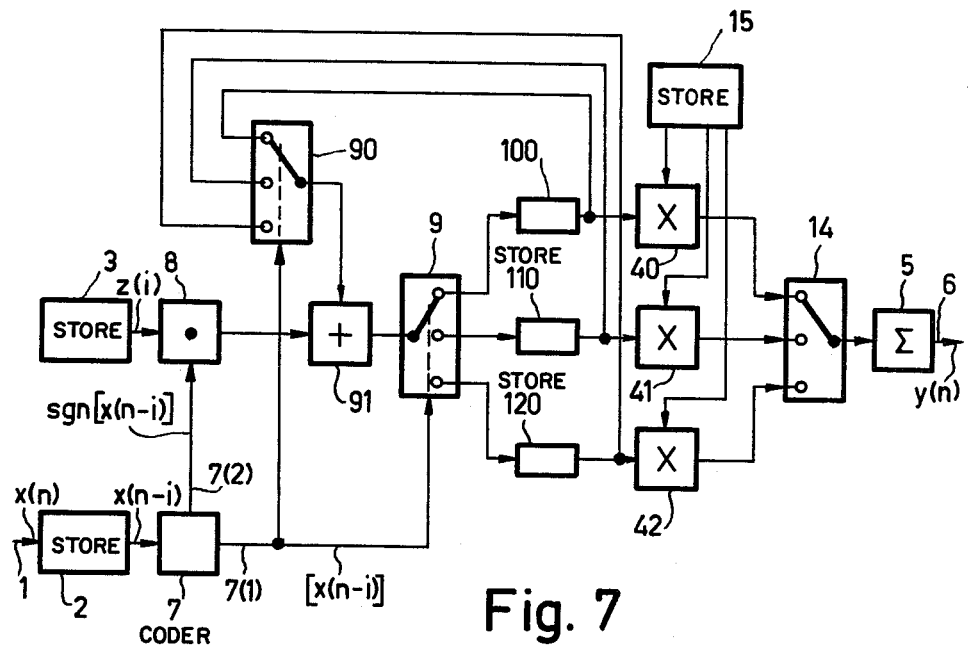
FIG. 7 shows a third embodiment of a digital signal processing arrangement according to the invention in the form of a non-recursive digital filter, which third embodiment is particularly suitable for implementation by means of a micro-processor.

FIG. 7 shows a further embodiment of the digital signal processing arrangement according to the invention in which use is made of an adder which is common for all auxiliary accumulators. In FIG. 7 the elements corresponding with the FIGS. 3 and 5 have again been given the same reference numerals as in the FIGS. 3 and 5. In this arrangement shown in FIG. 7 the common adder 91 is disposed between the output of the sign multiplier 8 and the input of the selector 9. The output of a second selector 90 is connected to a second input of the adder 91. This selector 90 is constructed in a manner analog to the selector 9 and is also controlled by the code words which occur at the output 7(1) of the coder 7. Storage devices 100, 110 and 120 whose contents constitute the contents of the relevant accumulators are connected to the outputs of the selector 9 in the manner shown in the Figure. More in particular the two selectors 9 and 90 are now controlled such by the first codewords that if the output of the adder 91 is connected to the input of a given storage device (for example the storage device 110), the output of this storage device is simultaneously connected through the selector 90 to the second input of the adder 92.

In given applications a given input signal $x(n)$ must be filtered in more than one manner, for example in a filter unit in which the frequency spectrum of the input signal must be divided into various frequency bands.

Figure 8:
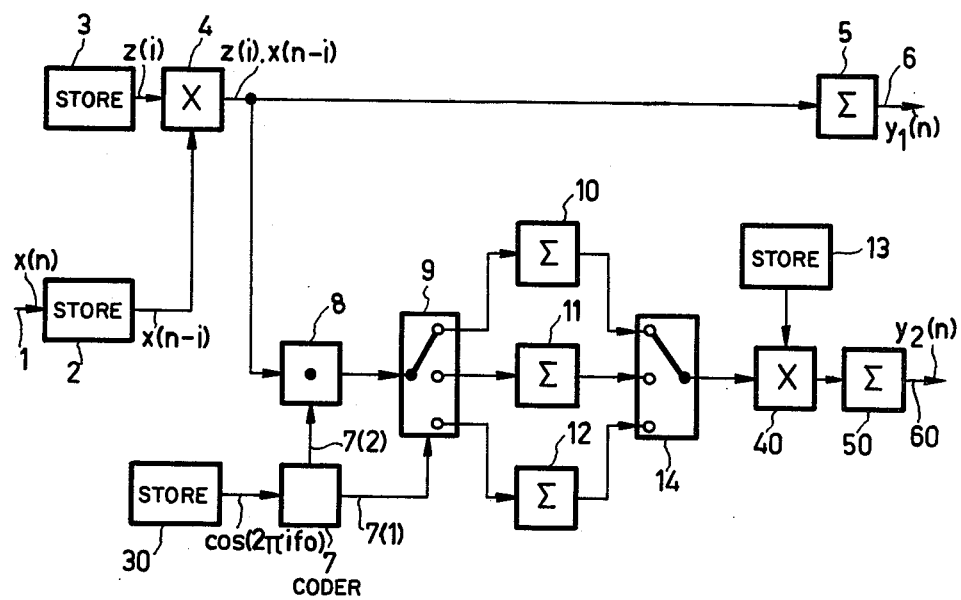
FIG. 8 shows a simple digital filter unit in which the digital signal processing arrangement according to the invention is applied.

FIG. 8 shows an arrangement with which simultaneously two filtered digital output signals $y_1(n)$ and $y_2(n)$ are derived from the input signal samples $x(n)$ in accordance with the relations:

$$y_1(n) = \sum_{i=0}^{N-1} x(n-i)z(i) \tag{14}$$

$$y_2(n) = \sum_{i=0}^{N-1} x(n-i)z(i) \cos(2\pi i f_o) \tag{15}$$

As known, expression (15) represents a non-recursive digital filter whose transfer function is a version shifted over $f_o$ in the frequency domain of the transfer function of the non-recursive digital filter which is described by expression (14). Herein $f_o$ is standardized at the sampling frequency of the digital system. The elements 1, 2, 3, 4, 5 and 6 in FIG. 8 constitute the known, conventional non-recursive digital filter which is also given in FIG. 1. At the end of a computing cycle the filter signal $y_1(n)$ appears at the output 6 of this filter. Storage device 30 contains the values $\cos(2\pi i f_o)$ ($0 \leq i \leq N-1$). For many values of $f_o$ the expression $\cos(2\pi i f_o)$ can assume only a limited number of different values. So it applies, for example, for $f_o = 1/12$: $\cos(2\pi i f_o) = 0, \pm\frac{1}{2}, \pm\frac{1}{2}\sqrt{3}, \pm 1$, so that the output samples $x(n-i)z(i)$ of the multiplier 4 can be fruitfully multiplied by numbers from the number series $\cos(2\pi i f_o)$ in a device according to the invention wherein $A_1 = \frac{1}{2}$, $A_2 = \frac{1}{2}\sqrt{3}$ and $A_3 = 1$ in order to determine the second filtered output signal $y_2(n)$. To that end the output samples of the multiplier 4 are applied to the sign multiplier 8 and the samples $\cos(2\pi i f_o)$ are applied to the coder 7. The elements 7, 7(1), 7(2), 8, 9, 10, 11, 12, 13 and 14 correspond with the elements in FIG. 3 having the same numbers. In addition, the elements 40, 50 and 60 correspond to the components 4, 5 and 6 respectively in FIG. 3. For the operation we therefore refer to the above description of the operation of FIG. 3 and here the remark will do that at the end of a computation cycle a sample of the second filtered signal $y_2(n)$ becomes available at the output 60.

It should be noted that the arrangement according to the invention can also be applied in, for example, interpolating filters, for example in the interpolating digital filter as described in Dutch patent application No. 74.12225 (PHN.7729) which has been laid open to public inspection.

It should be noted that when implementing the arrangement according to the invention in a microprocessor the coder 7 can be dispensed with, because with this microprocessor implementation the input signal samples $x(n)$ are utilized as address code for a partial program.

What is claimed is:

1. A digital signal processing arrangement for generating digital output signal samples $y(n)$ which are each formed by the sum of a given plurality of first signal samples $x(n)$ which are each modified by one of a plurality of second signal samples $z(n)$, comprising:
   first means for serially supplying first signal samples $x(n)$;

second means for serially supplying second signal samples $z(n)$;

multiplying means having an input circuit and an output circuit;

first coupling means for coupling the input circuit of the multiplying means to the first and second means comprising: means coupled to said first and second means for modifying each of the second signal samples $z(n)$ by an algebraic coefficient sgn $[x(n)]$ which represents the polarity of the first signal sample $x(n)$ associated with the signal sample $z(n)$, for generating signal samples of the form $z(n) \cdot \text{sgn } [x(n)]$; a plurality of auxiliary accumulators which each correspond to one of the magnitudes $[x(n)]$ of the first signal samples $x(n)$ and whose outputs are coupled to the input circuit of the multiplying means for multiplying the contents of each of the auxiliary accumulators by the algebraic factor $[x(n)]$ corresponding therewith;

adder means coupled to said multiplying means; and second coupling means which are controlled by said first signal samples $x(n)$ for applying the signal sample $z(n) \cdot \text{sgn } [x(n)]$ to that auxiliary accumulator which corresponds with the magnitude $[x(n)]$ of the first signal sample $x(n)$ associated with the second signal sample $z(n)$.

* * * * *

UNITED STATES PATENT AND TRADEMARK OFFICE
CERTIFICATE OF CORRECTION

PATENT NO. : 4,121,296

DATED : October 17, 1978

INVENTOR(S) : WILFRED A.M. SNIJDERS ET AL

It is certified that error appears in the above-identified patent and that said Letters Patent are hereby corrected as shown below:

Claim 1, lines 22 and 26, " $[x(n)]$ " should be -- $|x(n)|$ -- line 27, "coupled to said" should be --coupled to the output circuit of said--

*Signed and Sealed this*

*Twenty-second* Day of *May 1979*

[SEAL]

Attest:

RUTH C. MASON
*Attesting Officer*

DONALD W. BANNER
*Commissioner of Patents and Trademarks*